(12) United States Patent
Kline et al.

(10) Patent No.: US 6,392,428 B1
(45) Date of Patent: May 21, 2002

(54) WAFER LEVEL INTERPOSER

(75) Inventors: Jerry D. Kline, Argyle; Cecil E. Smith, Jr., Richardson, both of TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 0 days.

(21) Appl. No.: 09/440,751

(22) Filed: Nov. 16, 1999

(51) Int. Cl.[7] .............................................. G01B 31/02
(52) U.S. Cl. ...................... 324/755; 324/158.1; 324/754
(58) Field of Search .............................. 324/754, 158.1, 324/755, 760; 257/723

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,347,159 A | 9/1994 | Khandros et al. | 257/692 |
| 5,347,162 A | 9/1994 | Pasch | 257/773 |
| 5,382,898 A | 1/1995 | Subramanian | 324/754 |
| 5,476,211 A | 12/1995 | Khandros | 228/180.5 |
| 5,517,515 A * | 5/1996 | Spall et al. | 371/22.5 |
| 5,518,964 A * | 5/1996 | Distafano et al. | 437/209 |
| 5,532,612 A | 7/1996 | Liang | 324/760 |
| 5,600,257 A * | 2/1997 | Leas et al. | 324/754 |
| 5,685,885 A * | 11/1997 | Khandros et al. | 29/841 |
| 5,800,184 A | 9/1998 | Lopergolo et al. | 439/66 |
| 5,806,181 A | 9/1998 | Khandros et al. | 29/874 |
| 5,832,601 A | 11/1998 | Eldridge et al. | 29/843 |
| 5,834,946 A * | 11/1998 | Albrow et al. | 324/760 |
| 5,848,467 A | 12/1998 | Khandros et al. | 29/841 |
| 5,878,486 A | 3/1999 | Eldridge et al. | 29/840 |
| 5,885,849 A | 3/1999 | DiStefano et al. | 438/108 |
| 5,897,326 A | 4/1999 | Eldridge et al. | 438/14 |
| 5,900,738 A | 5/1999 | Khandros et al. | 324/761 |
| 5,915,752 A | 6/1999 | DiStefano et al. | 29/827 |
| 5,927,193 A * | 7/1999 | Balz et al. | 101/129 |
| 5,949,246 A | 9/1999 | Frankeny et al. | 324/765 |
| 5,950,070 A | 9/1999 | Razon et al. | 438/113 |
| 5,950,304 A | 9/1999 | Khandros et al. | 29/831 |
| 6,147,400 A * | 11/2000 | Faraci et al. | 257/723 |

* cited by examiner

*Primary Examiner*—Safet Metjahic
*Assistant Examiner*—Jimmy Nguyen
(74) *Attorney, Agent, or Firm*—Lawrence R. Youst; Smith, Danamraj & Youst, P.C.

(57) ABSTRACT

An apparatus and method for manufacture and testing of semiconductor chips (14) is disclosed. The invention comprises the use of an interposer (22) having a plurality of electrical contact pads (26) on each surface connected by a plurality of conductors (32, 34). After assembly of the interposer (22) to a semiconductor wafer (12), the wafer-interposer assembly (10) is attached to a testing unit (46) wherein the semiconductor chips (14) on the wafer (12) are tested. After testing, the interposer-wafer assembly (10) is singulated into a plurality of chip assemblies (62), each chip assembly (62) comprising a silicon chip (64) and the permanently attached interposer (66).

7 Claims, 3 Drawing Sheets

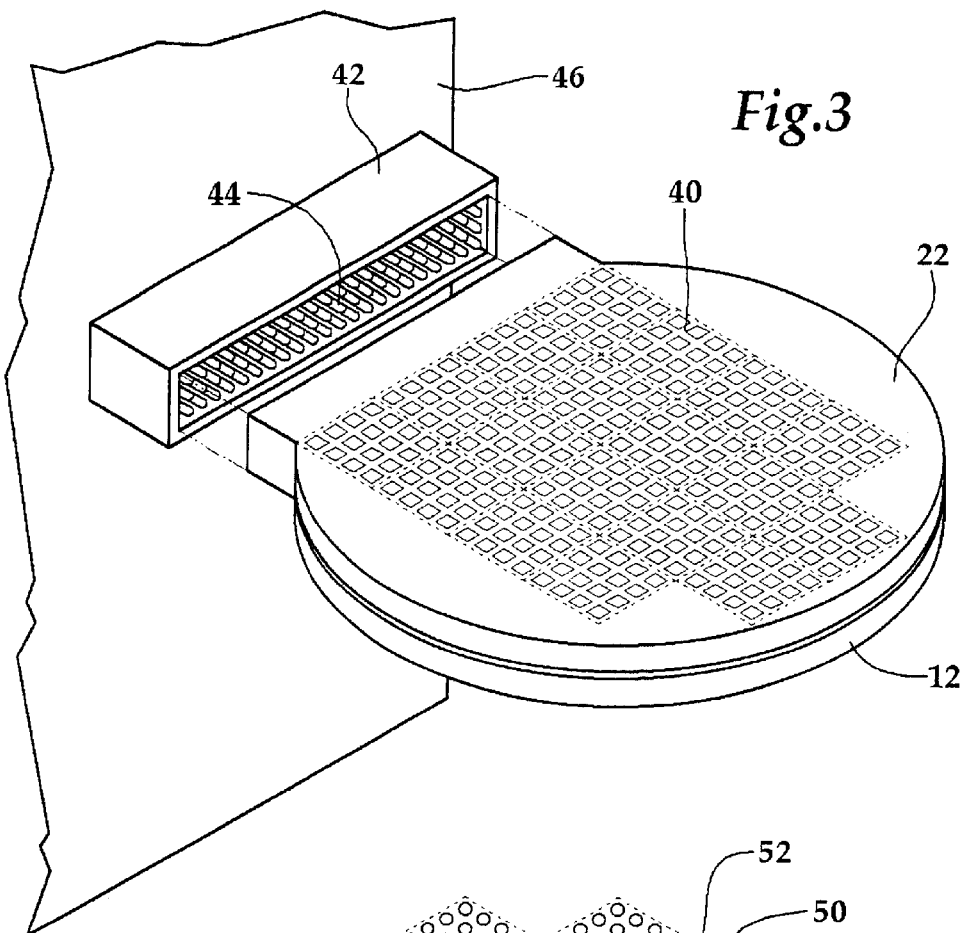
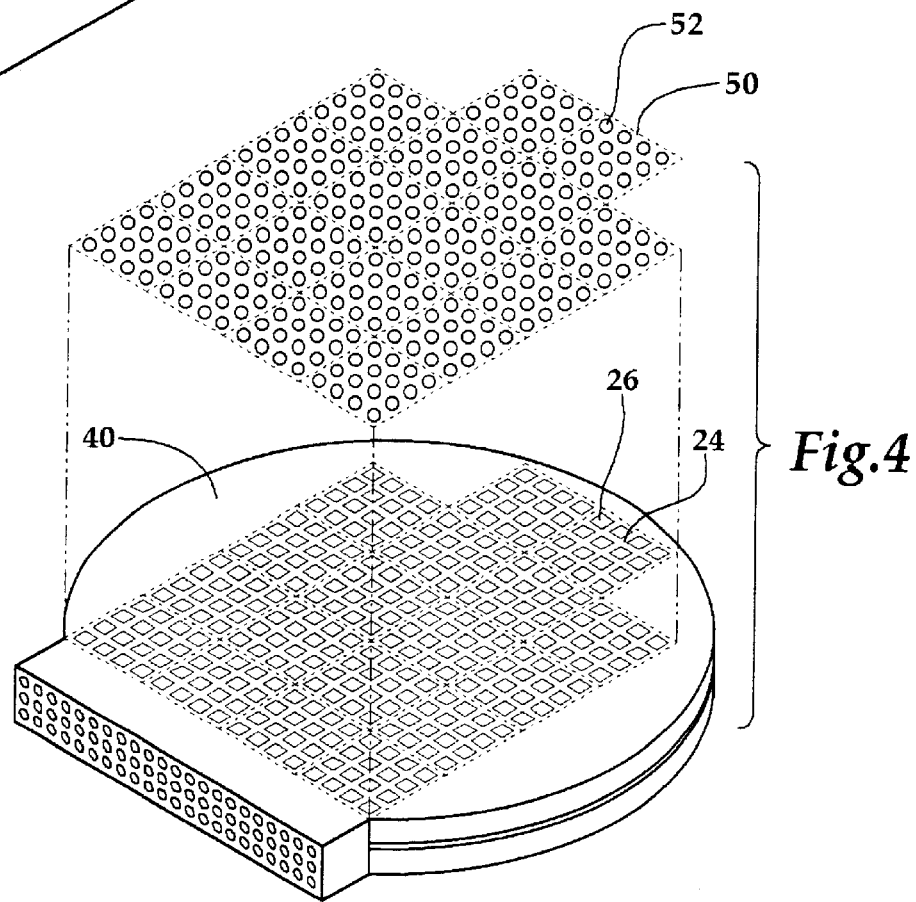

WAFER LEVEL INTERPOSER

TECHNICAL FIELD OF THE INVENTION

The present invention relates in general to the field of integrated circuits, and more particularly, to the area of wafer level testing of semiconductor chips using a wafer-interposer assembly and the manufacturing of semiconductor chip assemblies that are singulated from the wafer-interposer assembly.

BACKGROUND OF THE INVENTION

Modern electronic devices utilize semiconductor chips, commonly referred to as "integrated circuits," which incorporate numerous electronic elements. These chips are mounted on substrates which physically support the chips and electrically interconnect the chips with other elements of the circuit. Such substrates may be secured to an external circuit board or chassis.

The size of the chip and substrate assembly is a major concern in modern electronic product design. The size of each subassembly influences the size of the overall electronic device. Moreover, the size of each subassembly controls the required distance between each chip and other chips, or between each chip and other elements of the circuit. Delays in transmission of electrical signals between chips are directly related to these distances. These delays limit the speed of operation of the device. Thus, more compact interconnection assemblies, with smaller distances between chips and smaller signal transmission delays can permit faster operations. At present, two of the most widely utilized interconnection methods are wire bonding and flip-chip bonding.

In wire bonding, the substrate has a top surface with a plurality of electrically conductive contact pads disposed in a ring-like pattern around the periphery of the chip. The chip is secured to the top surface of the substrate at the center of the ring-like pattern, so that the chip is surrounded by the contact pads on the substrate. The chip is mounted in a face-up disposition. Fine wires are connected between the contacts on the front face of the chip and the contact pads on the top surface of the substrate. These wires extend outwardly from the chip to the surrounding contact pads on the substrate.

Wire bonding ordinarily can only be employed with contacts at the periphery of the chip. It is difficult or impossible to make connections with contacts at the center of the front surface of the chip using the wire bonding approach without resulting in shorts in the wire bonding. Accordingly, the contacts on the chip must be spaced at least about 100 micrometers apart from one another. These considerations limit the wire bonding approach to chips having relatively few I/O connections, typically less than about 250 connections per chip. Moreover, the area of the substrate occupied by the chip, the wires and the contact pads of the substrate is substantially greater than the surface area of the chip itself.

Wire bonding has a number of disadvantages, for example, bond wire pads act as a scale limiter, as the pads must be of sufficient size for a proper wire bond. Furthermore, bond wires add to the conductor path length between components, increasing the impedance, inductance and capacitance of the conductors as well as the potential for cross-talk. As such, the bond wires serve to limit not only the scale of the device, but also the maximum signal frequency that can be transmitted from the chip. In some designs, these phenomena can limit the maximum speed of a chip to less than seventy percent of its potential. Thus, in some cases the chip designer must make the chip large than necessary in order to accommodate the require I/O. These and other limitations of wire bond technology have become increasingly pronounced as the market makes increasingly higher demands on the size and performance of integrated circuit devices.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, such that the solder bump correspond to the appropriate contact pads of the substrate. The assembly is then heated so as to liquify the solder and bond each contact on the chip to the confronting contact pad of the substrate. Because the flip-chip arrangement does not require leads arranged in a fan-out pattern, it provides a very compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding is, therefore, very well suited for use with complex chips having large numbers of I/O contacts. Unfortunately, flip-chip bonding has faced a number of problems that have limited its implementation. As one example, assemblies made by traditional flip-chip bonding can be quite susceptible to thermal stresses. The solder interconnections are relatively inflexible, and may be subjected to very high stress upon differential expansion of the chip and substrate. These difficulties are particularly pronounced with relatively large chips.

Whatever type of contact is to be made to the chip, it is necessary for the chip to be tested. Testing normally includes "burn-in" which is used to identify manufacturing defects and parametric testing which is used to verify product conformance. In the past, testing has normally taken place after the wafer has been singulated to form the individual chips, and often requiring the chips to be packaged. Thus, in the past, it was necessary to manufacture the wafer, singulate the wafer into discrete chips, package the chips and test the packaged chips individually. It is only after these steps that defective chips are identified and discarded along with the test package in some cases.

The cost of testing and packaging may be even more pronounced for chips known in the semiconductor industry as "Known Good Die" (KGD). These chips are sold unpackaged after being tested for specific levels of conformance. Typically, in order to be considered a KGD, a chip must be singulated from the wafer, packaged for testing, tested, separated from the testing apparatus and sold as a bare chip. This bare chip is then repackaged by the purchaser. This is a very inefficient, but heretofore necessary process.

Therefore, a need has arisen for an apparatus and method that provides for the attachment of an interposer to a wafer that allows full parametric testing of each of the chips on the wafer to identify good chips prior to singulation. A need has also arisen for such an apparatus and method wherein the interposer becomes part of the chip assembly that is attached to a substrate.

SUMMARY OF THE INVENTION

The present invention disclosed herein provides an apparatus and method that utilize an interposer that is attached to a wafer that allows full parametric testing of each of the semiconductor chips on the wafer to identify defective chips prior to singulation. In the present invention, the interposer, after testing of the chips, becomes part of the chip assembly that is attached to a substrate.

The present invention comprises a wafer level interposer that has a first surface and a second surface. A first pattern of electrical contact pads is disposed on the first surface. These pad correspond to a pattern of electrical contact pads disposed on a surface of a semiconductor wafer. The interposer also has a second pattern of electrical contact pads disposed on the second surface. The second pattern of electrical contact pads typically conforms to an industry-standard layout. The interposer includes a testing connector having a plurality of testing contacts that allow for testing of the individual chip but are patterned to be automatically removed during wafer singulation. A set of conductors connects the electrical contact pads on the first surface to the electrical contact pads on the second surface. A set of testing conductors connects the electrical contact pads on the first surface to the testing contacts.

The interposer may include a multiplexer between the testing connectors and the first pattern of contact pads that allows for sequential testing of various parameters of each semiconductor chip on the wafer. The interposer may also include an array of conductive attachment elements disposed on the first pattern of electrical contact pads and an array of conductive attachment elements disposed on the second pattern of electrical contact pads.

In one method of the present invention, semiconductor chip assemblies are manufactured using the following steps. An interposer is connected to a semiconductor wafer having a plurality of semiconductor chip thereon to form a wafer-interposer assembly. The wafer-interposer assembly is attached to a testing apparatus such that the semiconductor chips may be tested. The wafer-interposer assembly is thereafter singulated into a plurality of chip assemblies.

In this method, the interposer may be connected to the semiconductor wafer by electrically connecting pads on the interposer to pads on each of the semiconductor chips. The testing procedure may include performing a parametric test of each semiconductor chip, testing the semiconductor chips in sequence, testing the semiconductor chips simultaneously, testing the semiconductor chips using a multiplexer, grading each of the semiconductor chips during testing and sorting the semiconductor chips based upon performance level or conformance or combination of the above.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 3 is a perspective view of a wafer-interposer assembly according to the present invention, being inserted into a testing apparatus;

FIG. 4 is an exploded view of a wafer-interposer assembly having an array of conductive attachment elements disposed on the upper surface thereof;

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not define the scope of the invention.

Figure 1:
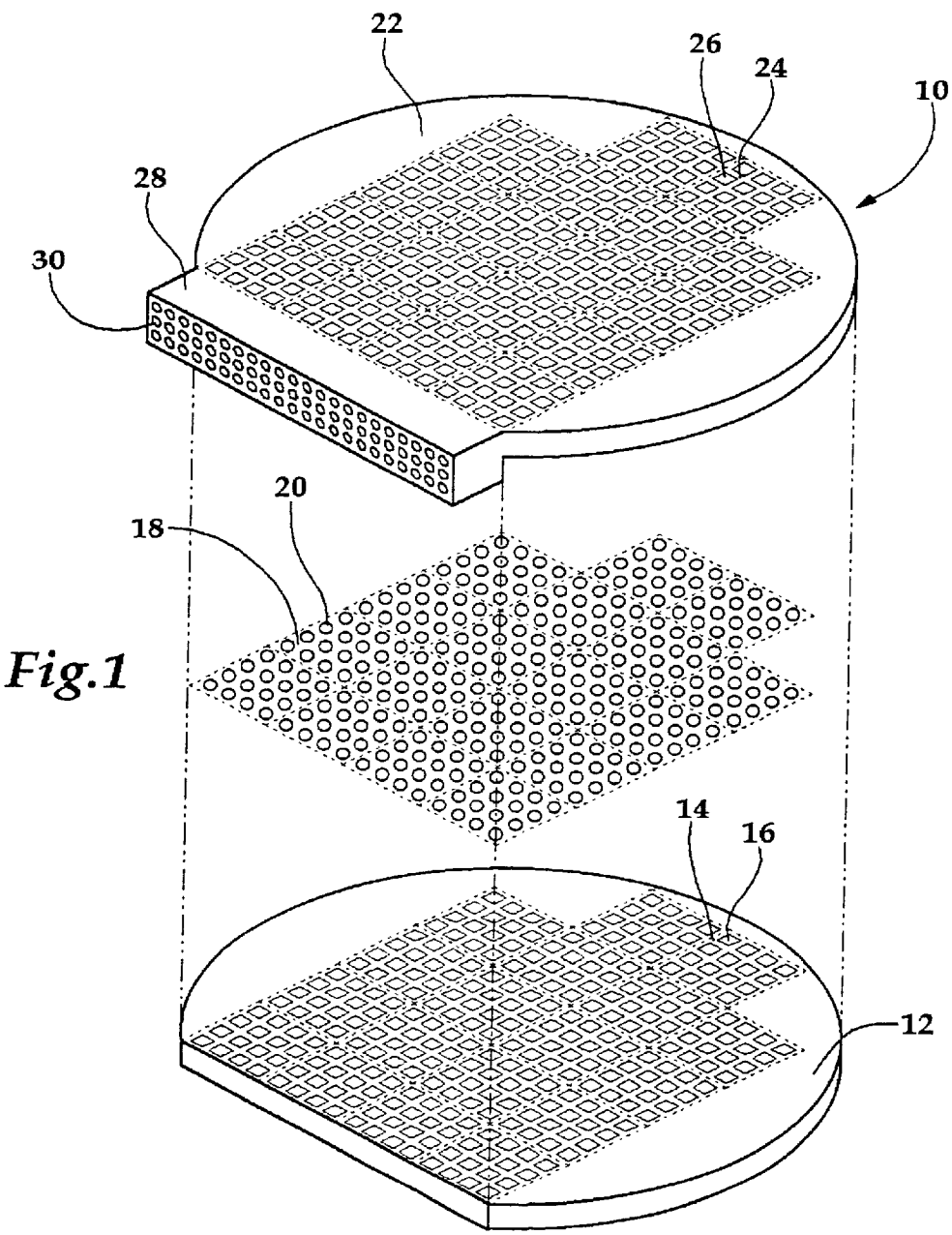
FIG. 1 is an exploded view of a wafer-interposer assembly according to the present invention.

The general features of a wafer-interposer assembly, generally designated 10, are shown in FIG. 1. A wafer-interposer assembly 10 comprises a wafer 12 having a plurality of chips 14 therein. Wafer 12 is depicted as having eighteen chips 14 for simplicity that are separated by dashed lines for clarity. Each chip 14 has a plurality of conductive pads 16 on its surface. For each chip 14 there is a corresponding array 18 of conductive attachment elements 20 one for each conductive pad 16. The conductive attachment elements 20 may be solder balls or bumps, screened solder paste, a set of conductive two part or heat cured epoxy, conductive thermoplastic balls or bumps or other electrical connection methods known in the art.

The interposer 22 has an array 24 of conductive pads 26 on the surface facing away from the wafer 12. The interposer 22 also has an array of conductive pads (not shown) on the surface facing the wafer 12, one for each conductive pad 16 on the surface of the wafer 12. After assembly, the conductive attachment elements 20 electrically connect and mechanically bond the pads 16 of each chip 14 to the facing interposer pads (not shown).

Figure 2:
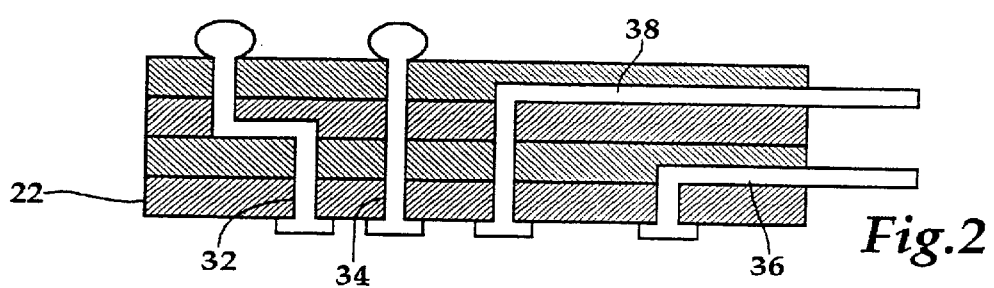
FIG. 2 is a cross-sectional view of an interposer according to the present invention.

As best seen in FIG. 2, interposer 22 includes a plurality of layer having etched routing lines and vias therein which serve as electrical conductors. One set of conductors, depicted as conductors 32 and 34 pass through the interposer 22 to electrically connect the pads 16 on the chips 14 to the pads of a substrate to which the chip assembly will be attached as explained in more detail below. Conductors 32 and 34 are selected to have suitable conductivity and may be, for example, copper.

Testing conductors, depicted as conductors 36 and 38 pass through the interposer 22 connecting the pads 16 of the chips 14 to the testing sockets 30 in the testing connector 28, as best seen in FIG. 1. The testing conductors may provide direct electrical connection between the testing sockets 30 and the pads 16, or may pass through a multiplexer or other intervening apparatus (not shown) incorporated into the interposer 22.

Assembly of the wafer 12 and interposer 22 is accomplished through creating a set of permanent electrical and mechanical connections between the wafer 12 and interposer 22 using the conductive attachment elements 20. The conductive attachment elements 20 will typically be implemented as features on both the upper and lower surfaces of the interposer 22 but may alternatively be placed on the wafer 12. Likewise, the attachment elements 20 could be incorporated into a sheet or similar structure sandwiched between the wafer 12 and interposer 22 during assembly.

In order to test the chips 14 using the interposer 22, it will be necessary that a testing apparatus be able to connect to the full array of pads 16 on each chip 14 through the testing connector 28. For a wafer 12 having a substantial number of chips 14, each having a large number of pads 16, it may be desirable to connect the pads 16 to the testing sockets 30 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14. Such a design removes the necessity for a dedicated testing socket 30 for each chip pad 16, thereby reducing the complexity of the testing connector 28.

While FIG. 1 depicts an interposer 22 having a single, rectangular testing connector 28, it should be understood by those skilled in the art that interposer 22 could be attached to a testing apparatus in a variety of ways. For example, interposer 22 may have multiple testing connectors having various sizes, shapes and numbers of sockets. Likewise, interposer 22 may alternatively have testing connectors mounted on the top surface thereof instead of or in addition to the side mounted testing connectors or may use cables for connection to a testing apparatus.

It should also be noted that interposer 22 may include bypass capacitors to minimize ground bounce and to filter bias voltage. These capacitors may be standard surface mount devices or embedded within interposer 22. Additionally, interposer 22 may include inductors to provide additional filtering. Impedance matching networks and line drivers may also be incorporated into interposer 22 to ensure signal integrity and to accurately measure parameters such as signal rise time and bandwidth and to protect the semiconductor chips 14 in the event of test equipment failure.

The pads 26 on the upwardly facing surface of interposer 22 are depicted in FIG. 1 having the identical geometry as the pads 16 of the chips 14 of the wafer 12. The invention herein disclosed is by no means limited to this geometry. As each die design may have unique pad geometry, one of the advantages of the present invention is that pads 26 of interposer 22 may utilize a geometry that is different than that of the chips 14. Traditionally, chip designers were limited in chip layout in that all connections between the elements of the chip 14 and the outside world had to be made either through the peripheral edges of the chip (for wire bonding) or at least through a standard pin or pad layout defined by a standardization body, such as the Joint Electrical Dimensional Electronic Committee (JEDEC). The interconnection requirements, therefore, have traditionally driven the chip layout.

Through the use of the interposer 22, the layout of a chip 14 and its pads 16 can be defined according to the interaction of the functional elements of the chip 14 rather than according to the standardization requirements. The interposer 22 can be designed with a standardized layout of pads 26 on its upper surface and can electrically connect each chip pad 16 to the corresponding upper interposer pad 26 without an interposer pad 26 being directly above its corresponding chip pad 16. Not only does the interposer 22 of the present invention provide for standardized interconnection, it also provides for the use of standard test hardware, software, cabling and connectors compatible with existing industry infrastructure.

An additional advantage of interposer 22 of the present invention is that more than one interposer 22 can be designed for each wafer 12. A manufacturer can then, by substituting a different interposer 22, modify the layout of the output pads 16 to conform to a different layout or packaging standard. Alternatively, if the chip 14 and interposer 22 are designed for modularity, a single interposer design may be useful on more than one chip design. A specific interposer design will typically be necessary for each unique wafer design.

Turning now to FIG. 3, a wafer 12 and interposer 22 are shown as an assembly 40 ready to be connected to a testing unit 46. The wafer-interposer assembly 40 interfaces to the testing unit 46 through a testing connector 42 comprising a plurality of testing contacts 44, shown here as pins. The testing contacts 44 in the testing connector 42 connect with the testing contacts 30 of the interposer 22. As noted above, the testing connector 42 need not incorporate a testing contact 44 for every chip pad. The contacts 44 may connect to the chips through a multiplexer or similar device (not shown).

After electrical connection to the testing unit 46, the wafer-interposer assembly 40 can be run through a complete parametric test or whatever subset thereof is deemed necessary for that particular chip design. During the course of testing, each function of the chip may ideally be tested across a range of conditions, so as to simulate real world operation. The testing unit 46 may incorporate a heating and cooling apparatus for testing the chips across a range of temperatures. The testing unit 46 may also incorporate a device for vibrating or otherwise mechanically stressing the chips 14. During testing, non-conforming chips are identified by the testing unit 46 such that they may be discarded after singulation of the wafer-interposer assembly 40. Alternatively, where a manufacturer sells a variety of grades of a particular model of chip, individual chips can be graded according to various performance criteria, such as maximum clock speed or thermal stability, for later classification and sorting. Such parametric data and attribute data are stored by the testing unit 46 and may be displayed or printed for the operator. Other information such as operator identification code, date, lot number and the like will be stored.

While FIG. 3 depicts a single wafer-interposer assembly 40 being tested, it should be understood by those skilled in the art that groups of wafer-interposer assemblies could be tested in a rack configuration or groups of racks of wafer-interposer assemblies could be tested in a lot configuration. In such a testing scenario, additional multiplexers, capacitor, impedance matching networks and related components would typically be used.

Turning now to FIG. 4, a wafer-interposer assembly 40 is shown having an array 24 of conductive pads 26 on its upper surface. The array 50 of conductive attachment elements 52 may typically be attached to interposer 22 prior to its attachment to wafer 12. Alternatively, the conductive attachment elements 52 may be attached to interposer 22 following testing of chips 14 of wafer 12. The conductive attachment elements 52 may be of the types discussed above with reference to FIG. 1.

Figure 5:
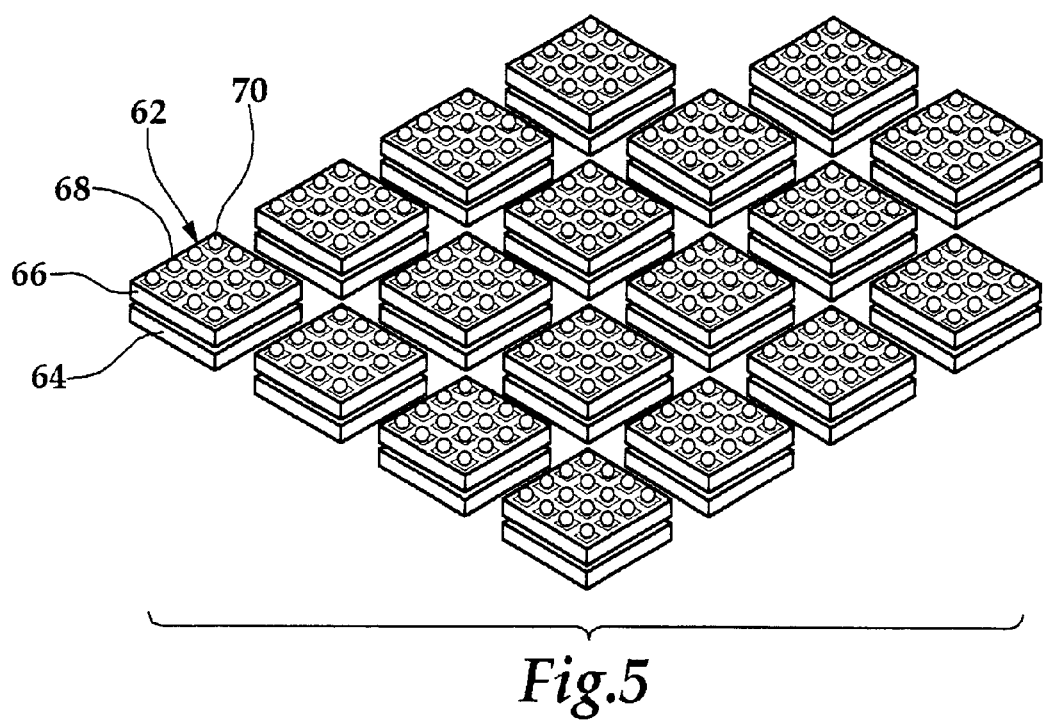
FIG. 5 is an isometric view of a plurality of chip assemblies after singulation of the wafer-interposer assembly.

FIG. 5 shows an array of chip assemblies 62, after singulation of the wafer-interposer assembly 40. Each chip assembly 62 comprises a chip 64, an interposer 66 and a plurality of conductive attachment elements 70 deposited on the conductive pads 68 on the exposed surface of the interposer 66. The chip assemblies 62 will be separated into conforming and non-conforming groups or sorted by performance level according to the results of the wafer level testing described in accordance with FIG. 3.

Figure 6:
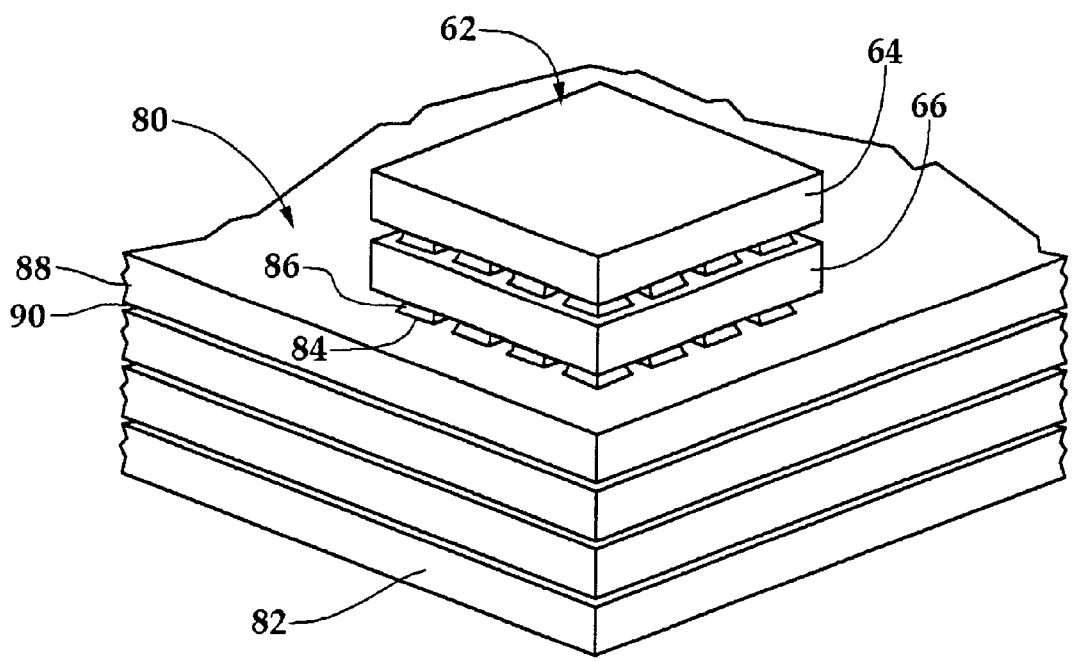
FIG. 6 is an isometric view of a chip assembly in place on a substrate.

FIG. 6 shows an assembly 80 comprising a chip assembly 62 mounted on a substrate 82 having a plurality of conductive layers 90 and dielectric layers 88. The chip assembly 62 is electrically and mechanically attached to pads 84 on the surface of the substrate 82 through conductive attachment elements 86. The chip assembly 62 communicates with other electronic devices (not shown) through the conductive layers 90 of the substrate 82. Assembled as shown, the interposer 66 provide electrical connection between the chip 64 the substrate 82.

In certain embodiments, the substrate 82 may represent a traditional FR4 circuit board. In other embodiments, the substrate 82 may be composed of a higher grade material suitable for use in multichip modules requiring finer conductor pitch. In the latter embodiment, the chip assembly 62 would generally be one of several such assemblies mounted on a small substrate in close proximity. This invention is well suited for implementation in these assemblies. It can be seen in FIG. 6 that the chip assembly 62 occupies an area of substrate 82 only slightly larger than the surface of the chip 64. This is in contrast to traditional semiconductor assemblies, in which the area consumed by each chip package is much greater than the area of the chip itself.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A wafer level interposer comprising:

a multi-layer sheet having a first surface and a second surface;

a first pattern of electrical contact pads disposed on the first surface and corresponding to a pattern of electrical contact pads disposed on a surface of a semiconductor wafer such that each electrical contact pad disposed on the first surface can be electrically connected to the corresponding electrical contact pad disposed on the surface of the semiconductor wafer;

a second pattern of electrical contact pads disposed on the second surface;

a testing connector disposed on a side of the multi-layer sheet, the testing connector comprising a plurality of testing contacts;

a set of conductors each of which connect at least one electrical contact pad on the first surface to at least one electrical contact pad on the second surface; and a set of testing conductors each of which connect at least one electrical contact pad on the first surface to at least one testing contact.

2. The interposer as recited in claim 1 further comprising a multiplexer between the testing connectors and the first pattern of contact pads.

3. The interposer as recited in claim 1 wherein the second pattern of electrical contact pads conforms to an industry-standard layout.

4. The interposer as recited in claim 1 wherein the testing conductors are patterned to be automatically removed during wafer singulation.

5. The interposer as recited in claim 1 further comprising an array of conductive attachment elements disposed on the first pattern of electrical contact pads.

6. The interposer as recited in claim 1 further comprising an array of conductive attachment elements disposed on the second pattern of electrical contact pads.

7. The interposer as recited in claim 1 further comprising an array of conductive attachment elements disposed on the first pattern of electrical contact pads and an array of conductive attachment elements disposed on the second pattern of electrical contact pads.

* * * * *